(12) United States Patent
Aubert

(10) Patent No.: US 7,952,454 B2
(45) Date of Patent: May 31, 2011

(54) METHOD AND DEVICE FOR GENERATING A HOMOGENEOUS MAGNETIC FIELD IN AN AREA OF INTEREST, ESPECIALLY FOR NMR IMAGING

(75) Inventor: Guy Aubert, Poitiers (FR)

(73) Assignee: Commissariat a l'Energie Atomique et aux Energies Alternatives, Paris (FR)

(*) Notice: Subject to any disclaimer, the term of this patent is extended or adjusted under 35 U.S.C. 154(b) by 197 days.

(21) Appl. No.: 12/159,282

(22) PCT Filed: Dec. 29, 2006

(86) PCT No.: PCT/FR2006/051439
§ 371 (c)(1),
(2), (4) Date: Jun. 26, 2008

(87) PCT Pub. No.: WO2007/077383
PCT Pub. Date: Jul. 12, 2007

(65) Prior Publication Data
US 2009/0045894 A1    Feb. 19, 2009

(30) Foreign Application Priority Data
Dec. 30, 2005    (FR) .................................... 05 54152

(51) Int. Cl.
*H01F 1/00*    (2006.01)
(52) U.S. Cl. ........................................ 335/216; 335/299
(58) Field of Classification Search ............... 335/216, 335/296–299; 505/704–706, 872, 879, 880–887, 505/891, 892, 898; 174/15.4, 15.5, 125.1
See application file for complete search history.

(56) References Cited

U.S. PATENT DOCUMENTS
4,623,864 A    11/1986 Inoue et al.
(Continued)

FOREIGN PATENT DOCUMENTS
EP    0 468 415 A3    1/1992
(Continued)

OTHER PUBLICATIONS

H. Lee, et al.: "A High-Temperature Superconducting Double-Pancake Insert for an NMR Magnet," IEEE Transactions on Applied Superconductivity, vol. 13, No. 2, 2003, pp. 1546-1549, Jun. 2003, XP002380205.

(Continued)

*Primary Examiner* — Elvin G Enad
*Assistant Examiner* — Bernard Rojas
(74) *Attorney, Agent, or Firm* — Weingarten, Schurgin, Gagnebin & Lebovici LLP

(57) ABSTRACT

The device for creating a uniform magnetic field in a zone of interest, in particular for nuclear magnetic resonance and magnetic resonance imaging, comprises an arrangement of superconductor coils disposed around a longitudinal axis (z) of the zone of interest. This arrangement of coils comprises at least one stack of a set of modular elements (8) distributed along the longitudinal axis (z), each modular element (8) comprising a rectangular-section conductor of superconductor material that is wound in continuous manner to form of a double pancake coil. The double pancake coil comprises a first single plane pancake coil (10) in the form of a spiral, a second single plane pancake coil (20) in the form of a spiral juxtaposed with and parallel to the first single pancake coil (10), and a transition segment (30) without any internal junction between the first and second single pancake coils (10, 20). Each single pancake coil (10, 20) has a connection end (11, 21) situated at the outer peripheral portion of the pancake coil, and the transition segment (30) enables an offset to be provided along the longitudinal axis (z) that is not less than the transverse dimension of the conductor along said axis.

17 Claims, 6 Drawing Sheets

U.S. PATENT DOCUMENTS

| | | | |
|---|---|---|---|
| 4,749,429 A | | 6/1988 | Condon et al. |
| 5,173,678 A | * | 12/1992 | Bellows et al. ............... 505/211 |
| 5,532,664 A | * | 7/1996 | Buckles et al. ............... 335/216 |
| 5,581,220 A | | 12/1996 | Rodenbush et al. |
| 5,861,788 A | * | 1/1999 | Ohkura et al. ............... 335/216 |

FOREIGN PATENT DOCUMENTS

| | | |
|---|---|---|
| EP | 0 472 197 A1 | 2/1992 |
| EP | 0 724 273 A3 | 7/1996 |
| EP | 0 807 939 A1 | 11/1997 |
| JP | 1-160354 A | 6/1989 |
| JP | 11-135319 A | 5/1999 |
| WO | 01/06524 A3 | 1/2001 |

OTHER PUBLICATIONS

International Search Report issued in PCT/FR2006/051439.

NAG Fortran Library Chapter Introduction E04—Minimizing or Maximizing a Function.

NAG Fortran Library Routine Document E04UCF/E04UCA.

Chapter 10 of "Numerical Recipes in Fortran 77: the Art of Scientific Computing", pp. 387-448, 1986-1992, Cambridge University Press.

pp. 70 and 71 of the book entitled "Experimental Methods in Magnetism, 1-Generation and Computation of Magnetic Fields", by H. Zijlstra, North-Holland 1967.

* cited by examiner

METHOD AND DEVICE FOR GENERATING A HOMOGENEOUS MAGNETIC FIELD IN AN AREA OF INTEREST, ESPECIALLY FOR NMR IMAGING

This application is a §371 national phase filing of PCT/FR2006/051439 filed Dec. 29, 2006, and claims priority to French Appln. 05 54152 filed Dec. 30, 2005.

The present invention provides a method and a device for creating a uniform magnetic field in a predetermined region in space that constitutes a zone of interest. A preferred field of application for the invention lies in nuclear magnetic resonance (NMR) and in magnetic resonance imaging (MRI).

An installation for imaging by NMR comprises, amongst other things:
- a magnet capable of creating an intense and uniform magnetic field (base field) in an examination volume that is large enough to receive a patient;
- a set of gradient coils arranged generally on a common cylindrical mandrel in order to be capable of generating magnetic field gradients in predetermined directions within the examination volume, during successive sequences; and
- a radiofrequency transceiver device for exciting the spins of those atomic nuclei for which NMR conditions are satisfied.

To create the base field, it is thus necessary to be able to have magnets producing an internal magnetic field that possesses a high degree of uniformity in three dimensions.

The frequencies used in NMR and in MRI (and the field intensities that are proportional thereto) are becoming ever greater. They are approaching 1 gigahertz (GHz) for proton NMR, i.e. close to 23.5 teslas (T), in small volumes, and it is expected that 500 megahertz (MHz) will shortly be reached in proton MRI, i.e. close to 11.75 T, within working diameters of about 1 meter (m). The corresponding magnets can therefore only be superconductor magnets. These field values would otherwise lead to prohibitive amounts of power being dissipated in resistive magnets, and they are unattainable by permanent magnets, since the magnetization of existing materials is not sufficient.

Increasing magnetic field intensity in the internal volume of interest leads to an increase of the field strength in the space outside the magnet. Safety rules that are presently in force require special precautions to be taken in zones where field strength exceeds the "5 gauss limit", i.e. a limit of only 0.5 milliteslas (mT). Without special counter-measures, that limit can be located several tens of meters away from the center of a high-field MRI magnet, and in general that is not acceptable.

A first way of moving this limit closer to the magnet consists in enclosing the magnet in a soft iron "box" having walls of sufficient thickness for the field outside the box to be below some given value, e.g. 0.5 mT. This produces "passive shielding" having the main drawback of potentially requiring hundreds of tons of iron for a high-field MRI magnet, and that likewise can be unacceptable.

A much more elegant solution consists in placing a second magnet of larger diameter around the main magnet and producing a field in the opposite direction. Although that does also reduce the working field in the volume of interest, a reduction of much greater proportion is obtained in the field in the outside space and it is possible to bring the 5 gauss limit back to the desired distance from the center of the magnet. Compared with the above-described solutions, and by misuse of language, it can be said that this provides "active shielding" for the magnet.

The principles for optimizing superconductor magnets are set out below.

In general, it is desired to produce, at low cost, a magnet that produces an internal magnetic field having given characteristics (intensity, three-dimensional uniformity in a volume of interest, . . . ), and with accessibility that is likewise predetermined (empty space around the volume of interest), possibly also with additional conditions concerning the outside field if it is desired to use active shielding.

More particularly with reference to MRI magnets for use on man, the most appropriate shape consists in providing free access in the form of a cylindrical tunnel into which a subject is inserted longitudinally.

Consequently, it is assumed below that the magnet has axial symmetry about an axis Oz with an empty circular opening of diameter D (this is the diameter beyond which the conductors of the superconductor magnets can be situated; the real empty opening necessarily being slightly smaller because of the cryogenic casing that is required).

As well as Cartesian coordinates (x, y, z), use is also made, where appropriate, of the associated cylindrical coordinates $(\rho, \phi, z)$ and spherical coordinates $(r, \theta, \phi)$.

The problem thus consists in determining the "overall" or "technical" current density:

$$\vec{j} = j_\phi(\rho,z)\vec{u}_\phi$$

for the coil, and also the shape $\Sigma$ of its axial half-section, outside that of the empty cylinder of diameter D, so as to satisfy the required conditions for the magnetic field while minimizing capacity to convey current:

$$\iiint |\vec{j}| d\tau$$

It should be observed that a real "conductor" is constituted in outline by a set of superconductor filaments that conduct essentially all of the current, and that are surrounded by a certain quantity of copper. The assembly constitutes a wire or cable of section that is generally circular or rectangular and that is covered in insulation (enamel or other). Coiling such a conductor may lead to gaps (will necessarily lead to gaps if the section is circular), and it may be necessary to use mechanical reinforcing elements, e.g. made of non-magnetic steel. The "overall" current density ignores such structural details by taking an average on a larger scale of the "continuous-medium approximation" type. If the cables present sections of large dimensions, in order to perform calculations that are more refined, in particular concerning three-dimensional uniformity of the field, it is possible to return to the actual positions of the superconductor strands and to the actual current densities conveyed thereby.

The current transport capacity of a coil of volume V in which current of density $j_0$ is uniform is simply $j_0V$, and if the conductor used is of constant section and conveys a current of magnitude I, then it is equal to Il where l is the length of the corresponding conductor. The economic performed of different conductors are compared in terms of cost for given capacity, e.g. ≈$10 per kiloamp-meter (kA.m) for copper at ambient temperature and ≈$1/(kA.m) for NbTi at 5 T and at a temperature of 4.2 kelvin (K), . . . .

Dimensional analysis leads to defining the quality factor $Q \leq 1$ for a superconductor magnet (where quality factor is analogous to the Fabry factor for resistive magnets) by using the following relationship:

$$B_0 = Q \frac{\mu_0 \iiint |\vec{j}| d\tau}{\pi D^2}$$

in which $B_0$ is the field at the center of the volume of interest. The maximum value 1 for Q is obtained for a circular turn of sectional dimensions that are very small compared with its diameter. Any other condition or constraint that is imposed in addition to complying with the empty diameter D will lead to a reduction in Q, and thus to additional cost for the same field value.

In practice, a real magnet is constituted by a set of N coaxial coils of rectangular section with uniform "overall" current density, each of the coils being characterized by five parameters $(a_1, a_2 > a_1, b_1, b_2 > b_1, j_0)_{i \in [1, N]}$, where $a_1$ and $a_2$ are respectively the inner and outer radii, $b_1$ and $b_2$ are the z positions of the ends, and $j_0$ is the current density measured algebraically around Oz.

The conditions imposed on the magnetic field and the target function that is to be minimized (total current transport capacity) are non-linear functions of these 5N parameters that are determined and that can also be subject to bounds such as:

$$a_{1i} \geq \frac{D}{2} \forall i$$

to guarantee the diameter D for the access tunnel; and $$a_{2i} \leq \frac{D'}{2} \forall i$$

if it is desired to limit the maximum outside diameter to D', . . . , or to constraints that are more complicated such as those that limit $j_{0i}$ as a function of the peak field to which the conductor is subjected within coil i.

From a mathematical point of view, this constitutes a non-linear optimization problem with non-linear constraints and with possible bounds on certain variables or linear combinations of variables, for which the difficulties and methods of resolution are well known (see for example Chapter E04 in the NAG mathematics library or Chapter 10 in "Numerical recipes in Fortran 77: the art of scientific computing", by W. H. Press et al., Cambridge University Press), provided the conditions imposed on the field are suitably expressed.

Among these constraints, those relating to the three-dimensional uniformity of the field are essential for NMR or MRI magnets.

In a region of space that is "magnetically empty" (i.e. without any electric current nor any material of non-negligible magnetic susceptibility), each component $B_x$, $B_y$, and $B_z$ of the magnetic field has its own zero Laplacian. For example, regardless of the sources of the field, $\Delta B_z = 0$ and $B_z(\vec{r})$ has a single development in spherical harmonics of the form:

$$B_z(r, \theta, \varphi) = B_0 + \sum_{n=1}^{\infty} r^n \left[ Z_n P_n(\cos\theta) + \sum_{m=1}^{n} (X_n^m \cos m\varphi + Y_n^m \sin m\varphi) W_n^m P_n^m(\cos\theta) \right]$$

where $W_n^m$ is a numerical weighting factor such that:

$$|W_n^m P_n^m(\cos\theta)| \leq 1$$

such as $|P_n(\cos\theta)|$.

This development is valid only for $r < r_{max}$, the radius of the largest "magnetically" empty sphere of center O. The coefficients of degree n (where the order is written m) have the form $\alpha r_{max}^{-n}$, where $\bar{\alpha}$ has the dimension of a field, and the development converges more quickly the smaller r is relative to $r_{max}$.

The set of coefficients $B_0$, $Z_n$, $X_n^m$, $Y_n^m$ is unique and serves to express not only $B_z$, but also the other components of the field and the scalar and vector potentials from which it derives.

Since it is desired to produce a field that is as uniform as possible $\vec{B} = B_0 \vec{u_z}$ in the volume of interest around the origin O, consideration is given to the component $B_z$ only. If this uniformity is achieved only approximately, i.e. $\vec{B} = B_0 \vec{u_z} + \vec{b}$, where $|\vec{b}| \ll B_0$, then the resonant frequency is proportional to:

$$|\vec{B}| = \sqrt{(B_0 + b_z)^2 + b_x^2 + b_y^2} = B_0 \sqrt{1 + 2\frac{b_z}{B_0} + \frac{b^2}{B_0^2}} \square B_0 + b_z + \frac{b_x^2 + b_y^2}{2B_0} + \ldots = B_0 + b_z + B_0 \times O\left(\frac{b}{B_0}\right)^2$$

It can be seen that only the components $b_z$ is involved in terms of part per million (ppm) for example so long as $$\frac{b}{B_0} \leq \approx 10^{-3}.$$

The functions $r^n P_n^m(\cos\theta)$ $\forall n \geq 0$, $0 \leq m \leq n$ constitute a complete set of orthogonal functions, which means that any departures from uniformity represented by one of these functions cannot be compensated by departures represented by another one of these functions except at one particular point, and certainly not throughout the volume of interest. Since the coefficients $Z_n$, $X_n^m$, $Y_n^m$ governing these departures are decreasing functions of degree n, the resulting three-dimensional uniformity is improved by making the shape of the field sources (coils) such that all of these coefficients are zero for all degrees that are less than or equal to some given degree $n_0$.

Use is made in the first place of the principle of symmetry in order to guarantee that certain coefficients are zero. Thus, if, as in the situation under consideration, the system of sources possesses axial symmetry or symmetry of revolution about the axis Oz, then all of the coefficients $X_n^m$, $Y_n^m$ are identically zero. In addition, if the system is symmetrical about the plane xOy, then all of the coefficients of odd degree $Z_{2p+1}$ are also identically zero and the development of $B_z$ reduces to:

$$B_z(r, \theta, \varphi) = B_0 + \sum_{p=1}^{\infty} Z_{2p} r^{2p} P_{2p}(\cos\theta)$$

The field then also has a component that is perpendicular to the axis:

$$B_\rho(r, \theta, \varphi) = -\sum_{p=1}^{\infty} \frac{1}{2p+1} Z_{2p} r^{2p} P_{2p}^1(\cos\theta)$$

To obtain the desired uniformity, it is therefore necessary to determine the 5N parameters $(a_1, a_2 > a_1, b_1, b_2 > b_1, j_0)_{i \in [1,N]}$ for the coils in such a manner that:

$$Z_{2p} \equiv 0 \forall p \leq p_0$$

the departures from uniformity then being governed by the first non-zero coefficient $Z_{2(p_0+1)}$.

If consideration is given to two circular turns about the same axis and of section that is very small compared with their radius, the turns conveying currents of the same magnitude and being separated by a distance equal to their radius, i.e. turns that are said to be in the Helmoltz position, then $Z_2 \equiv 0$, and the non-uniformity of the field in the vicinity of the center O of the system is governed by $Z_4$. This situation corresponds to $p_0=1$ in the above general discussion. In practice, for the NMR or MRI magnets under consideration in which it is desired to minimize the quantity of superconductor material used, i.e. in which it is desired for the "diameter" of the volume of interest to be as close as possible to the diameter D of the empty tunnel in the magnet, it is possible to go as far as $p_0=6$ or 7.

Once the theoretical configuration has been determined in application of the above-defined requirements, it is necessary to use real conductors to produce coils of rectangular axial half-section that reproduce the desired configuration as accurately as possible. The differences therewith that arise during practical implementation do not significantly modify the non-zero coefficients of the theoretical development, but do give rise to lower order coefficients appearing that ought to have been zero. For example, a small amount of asymmetry in the coils about the plane xOy will give rise to odd coefficients $Z_1$, $Z_3$, . . . of increasing magnitude with increasing asymmetry. Ovalization of the coiling mandrels will lead to the appearance of coefficients of the type $X_n^m, Y_n^m$. These non-uniformities can be corrected subsequently by appropriate spacer devices known as "shims".

If the constraints imposed during optimization as described above make this possible, the $j_{0i}$ coils can be different. In particular, the "overall" current densities can be greater in the regions when the magnetic field is less high. Since the stability over time of the magnet gives rise in practice to a requirement that all of the coils should be connected in series, so that the same current is passing through each of the conductors, it is then necessary to use different real conductors for each current density value. This is known as "grading".

The technique used for the NMR or MRI magnets is the layer coiling technique of W. L. L. Lenders, as proposed in particular in Philips Tech. Rev., 23, pp. 365-404, 1962) for conductors of circular section, which is the so-called orthocycling coiling that provides the best possible "filing" of the rectangular axial half-section.

This technique is shown in FIG. 3 where there can be seen a mandrel 140 with two end plates 141 and 142 between which the first and second layers 110 and 120 are made from wire of circular section having a diameter d. A number n of turns is formed between the end plates 141, 142 with an offset of d/2 between the turns of two successive layers 110, 120, and with the distance between the end plates 141, 142 being equal to (n+½)d.

It is also possible to coil the layers helically with the unavoidable difficulty of going from one layer to the next at each end by suitably positioning insulating spacers.

It should be observed that the available lengths of conductor are limited by the manufacturing techniques used and that it is therefore necessary to assume there will be junctions between successive lengths. There are particular problems in making these junctions, which, if not superconductive, desirably present resistance that is as low as possible. In order to avoid disturbing three-dimensional uniformity and in order to place the junctions in zones of low field, these junctions need to be far away from the volume of interest.

High-field MRI magnets (≈10 T) require a considerable weight of conductor (several tens of (metric) tonnes) and the layer coiling technique leads to individual coils i∈[1,N] of very large weight, and thus difficult to handle, together with numerous junctions that are not always easy to put into place. The magnetic energy stored in the magnet then also becomes very large (several 100 megajoules (MJ)) which means that it is necessary to use currents that are as high as possible (>1000 amps (A)) in order to reduce the voltage that would appear in the event of an accidental transition of the magnet from the superconducting state to the normal state (the so-called "quench" phenomenon).

The section of the conductor that is to be used can then be equal to or greater than about 10 square millimeters ($mm^2$), which makes it difficult to wind coils using the previously known techniques for making MRI magnets.

The invention seeks specifically to remedy the above-mentioned drawbacks and to make it possible to produce high-field magnets capable of creating an internal magnetic field that is uniform, while facilitating handling an assembly of its component elements during fabrication.

The invention thus seeks to provide devices for creating a uniform magnetic field that presents fabrication cost that is small and performance that is improved, while also presenting a high level of flexibility in implementation.

The invention also seeks to provide superconductor magnets that present a small external magnetic field.

According to the invention, these objects are achieved by a device for creating a uniform magnetic field in a zone of interest, in particular for nuclear magnetic resonance and magnetic resonance imaging, the device comprising an arrangement of superconductor coils placed around a longitudinal axis (z) of said zone of interest, which zone of interest lies inside said arrangement of superconductor coils, the device being characterized in that the arrangement of superconductor coils comprises at least one stack of a set of modular elements distributed along said longitudinal axis and centered on said longitudinal axis, each modular element comprising a conductor of rectangular section made of superconductor material wound continuously in the form of a double pancake coil comprising a first single plane pancake coil, a second single plane pancake coil juxtaposed parallel to the first single pancake coil, and a transition segment without any internal junction between the first and second single pancake coils, each single pancake coil having a connection end situated at the outer peripheral portion of the pancake coil for connection via a junction to a connection end of an adjacent modular element, and the transition segment making it possible to offset the second single pancake coil along the longitudinal axis relative to the first single pancake coil through a distance not less than the transverse dimension of the conductor along said axis, each of the first and second single plane pancake coils being made from half-circumferences of radius increasing by half the thickness of the conductor between two consecutive half-circumferences, and alternating between two centers for the half-circumferences that are separated by half the thickness of the conductor.

In a particular embodiment, first insulating spacers are disposed between the first single pancake coil and the second single pancake coil within each modular element, and second insulating spacers are disposed between successive modular elements.

The transition segment advantageously extends around the longitudinal axis over an extent of less than $2\pi$, and preferably over an extent of less than $\pi$.

In a particular embodiment, the transition segment is made in the form of a sinusoidal ring constituted by winding a sinewave around a circular cylinder having said longitudinal axis as its axis.

Each stack comprises several tens of identical modular elements.

In a preferred embodiment, the device comprises at least seven stacks of identical modular elements disposed in alignment along said longitudinal axis and symmetrically about a midplane of the zone of interest that is perpendicular to said longitudinal axis, the thicknesses of the stacks and the lengths of the empty separation spaces between pairs of adjacent stacks increasing going away from the midplane towards the ends of the device.

Advantageously, the device further comprises at least one superconductive compensation coil surrounding the stacks of modular elements and presenting an axis that coincides with the longitudinal axis, said superconductive compensation coil conveying a current in the direction that is opposite to the direction of the current in said stacks.

Under such circumstances, the superconductive compensation coil is made in the form of a layer coil.

In a particular embodiment, the set of stacks and of compensation coils conveying currents is such that at least the dipolar moment $Z'_2$ of the current distribution corresponding to the magnetic field outside the zone of interest is zero, while simultaneously the coefficients $Z_{2p}$ of the development of the magnetic field in the zone of interest are zero up to a fixed order $Z_{2p0}$ greater than 2.

In another particular embodiment, the set of stacks and of compensation coils conveying currents is such that at least the dipolar moment $Z'_2$ and the quadrupolar moment $Z'_4$ of the current distribution corresponding to the magnetic field outside the zone of interest are zero, while simultaneously the coefficients $Z_{2p}$ of the development of the magnetic field in the zone of interest are zero up to a fixed order $Z_{2p0}$ greater than 2.

In general, the set of stacks and of compensation coils conveying currents is such that the multipolar magnetic moments of the current distribution corresponding to the magnetic field outside the zone of interest are zero from the minimum order 2 up to a fixed order $Z'_{2p0}$ greater than 2, while simultaneously the coefficients $Z_{2p}$ of the development of the magnetic field in the zone of interest are zero up to a fixed order $Z_{2p0}$ greater than 2.

By way of example, the stacks of modular elements are placed around a zone of interest of diameter equal to or greater than 1 meter.

In a particular application, the magnetic field created by the stacks of modular elements is greater than or equal to 10 T.

The section of the conductor of a modular element lies in the range a few square millimeters to several tens of square millimeters.

In an embodiment, a modular element presents weight lying in the range a few tens of kilograms to about one hundred kilograms.

The invention also provides a method of fabricating a device for creating a uniform magnetic field, the method being characterized in that it comprises the following steps:

a) preparing a length of superconductor material wire of rectangular section and without any connection;

b) putting the length of wire into the form of a central segment for creating a transition segment between two juxtaposed single pancake coils;

c) placing the resulting transition segment and half of the length of wire extending from the transition segment into place on a mandrel of special shape, and securing them thereto;

d) turning the mandrel in a first direction to form the first single plane pancake coil from the other half of the length of wire that is left free relative to the mandrel, the mandrel being of a shape such that the first single plane pancake coil is made up of half-circumferences of radii that increase by half a thickness of the conductor between two consecutive half-circumferences, with the half-circumferences alternating between two centers that are spaced apart by half a thickness of the conductor;

e) temporarily securing the mandrel to the first single pancake coil that has been formed and releasing the transition segment from the half of the length of wire that was previously temporarily secured to the mandrel;

f) causing the mandrel to turn in a second direction to form a second single plane pancake coil from the release half of the length of the wire, the mandrel presenting a shape such that the second single plane pancake coil is made up of half-circumferences of radii that increase by half the thickness of the conductor between two consecutive half-circumferences, with the half-circumferences alternating between two centers that are spaced apart by half the thickness of the conductor;

g) removing the mandrel from the resulting modular element and forming connection ends at the outer peripheral portion of each single pancake coil; and h) assembling and connecting together along a longitudinal axis a plurality of modular elements prepared in accordance with steps a) to g).

The method may also include the step of inserting first insulating spacers between the first single pancake coil and the second single pancake coil within each modular element, and of inserting second insulating spacers between the various successive modular elements making up a stack.

Other characteristics and advantages of the invention appear from the following detailed description of particular embodiments given as examples and with reference to the accompanying drawings, in which.

To create a relatively intense uniform magnetic field, such as the base field that is to be created in a zone of interest in an MRI installation, the invention proposes doing without the prior art coil systems, which are generally layer structures with at least ten coils of very heavy unit weight, of the order of several hundreds of kilograms, and replacing them with stacks, each comprising a set of modular elements 8 of relatively modest weight, e.g. of the order of 100 kilograms (kg), and thus easy to handle.

Figure 1:
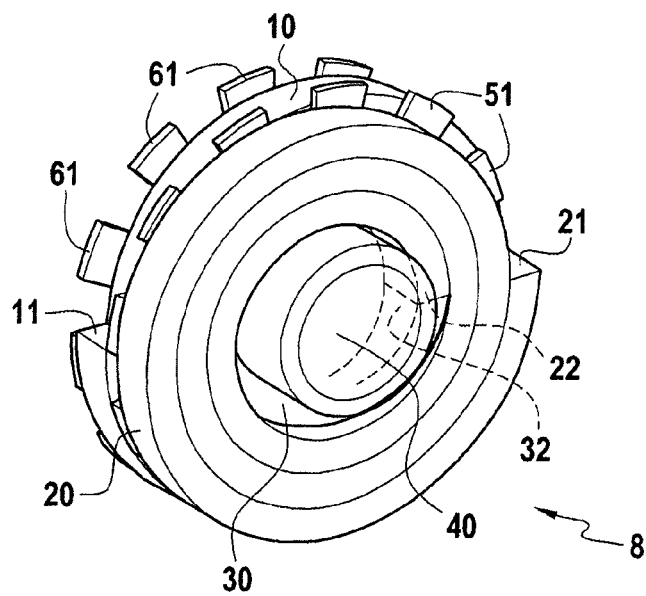
FIG. 1 is a perspective view of an example of a double-pancake coil modular element suitable for use in a device of the invention for creating a magnetic field.

As shown in FIG. 1, each modular element 8 comprises a double pancake coil made from a wire of superconductor material presenting a relatively large rectangular section, of width and of length that are typically both of several millimeters.

The modular element 8 in the form of a double pancake coil has no internal junction, and it presents two ends 11 and 12 that are situated on the outside, in a zone that is suitable for making junctions with adjacent modular elements, since the magnetic field on the outside is much weaker than at the center of the magnet.

The modular elements 8 are stacked on the central magnet tube 40 that presents a longitudinal axis z.

Installation spacers 61 are placed between two adjacent modular elements 8.

FIG. 1 shows both insulating spacers 61 in the background against which the following modular element comes to bear, and insulating spacers 51 interposed between the two single pancake coils 10 and 20 making up the double pancake coil of the modular element 8 shown.

The insulating spacers 51, 61 allow a possible cryogenic fluid to circulate, in particular superfluid helium if it is desired to work at temperatures as low as 4.2 K (boiling temperature of helium under normal conditions), in order to improve the physical properties (critical field and current) of the superconductor used and also to take advantage of the remarkable properties of the superfluid in order to stabilize the operation of the magnet better.

Figure 4:
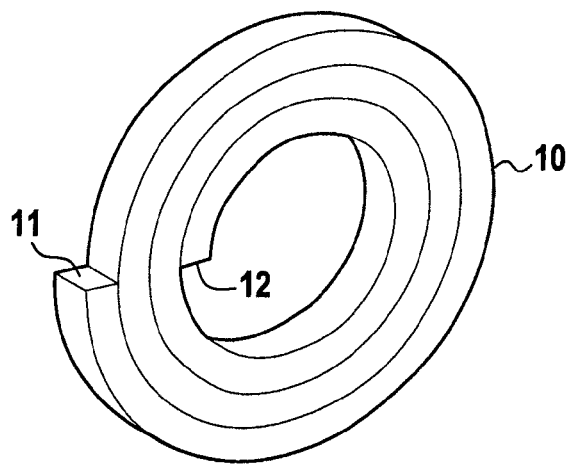
FIG. 4 is a perspective view of a first single pancake coil suitable for being incorporated in the modular element of FIG. 1.
Figure 5:
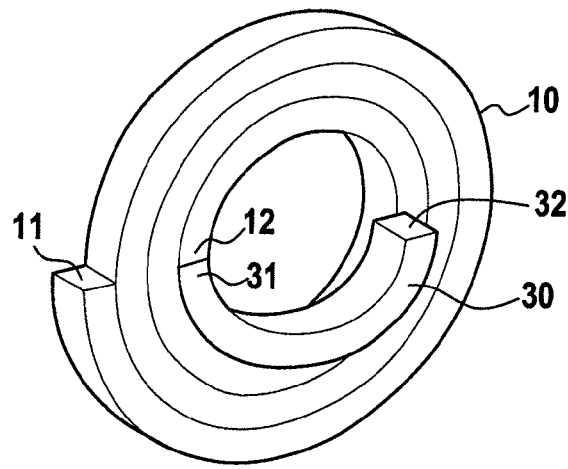
FIG. 5 is a perspective view of the single pancake coil of FIG. 4 having a transition segment added thereto.
Figure 6:
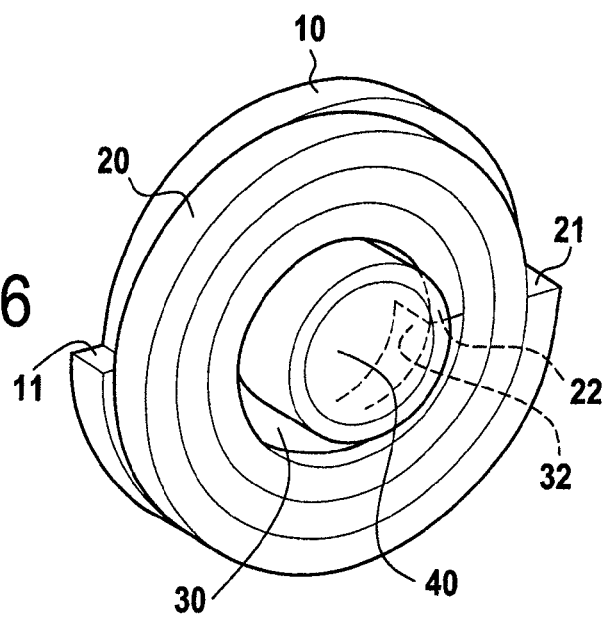
FIG. 6 is a perspective view of a double pancake coil of the invention.

FIGS. 4 to 6 show the principle on which the double-pancake coil coil is built up.

An example of a first coil in single-pancake coil form 10 can be seen in FIG. 4. The conductor presents an outer end 11 and an inner end 12.

The single pancake coil 10 may be of the Archimedes' spiral type, but it is preferably made up of circular arcs as described in greater detail below.

In order to form a double pancake coil, it is necessary to add a transition segment 30 to the single pancake coil 10, starting from its inner end 12, the transition segment 30 presenting a first end 31 that is connected to the inner end 12, and a second end 32 that projects out from the plane of the single pancake coil 10.

The transition segment 30 thus enables the inner end 12 of the single pancake coil 10 to be offset along the axis of the pancake coil 10 as far as the end 32 of the transition segment 30 by an amount that is not less than the width of the conductor constituting the pancake coil 10. In FIG. 5, the transition zone 30 occupies half a turn, however it could be greater or smaller.

In order to make a complete double pancake coil, the inner end 32 of the transition segment 30 is then connected to the inner end 22 of a second single pancake coil 20, that is identical to the first single pancake coil 10, but that is turned to face the other way, as shown in FIG. 6. The second single pancake coil 20 has an outer end 21 that constitutes the second end of the modular element formed by this double pancake coil.

In practice, the method described above with reference to FIGS. 4 to 6 is not actually used, since it is desired specifically to avoid having junctions in the vicinity of the connections between the ends 31 and 32 of the transition segment 30, and the double pancake coil is preferably made using a single one-piece length of wire.

In order to fabricate a double pancake coil presenting the final structure shown in FIG. 6 or in FIG. 1, a single length of rectangular section superconductor wire is thus used, beginning coiling from the middle of said length so as to shape the transition segment between the two single pancake coils. Thereafter, one of the two single pancake coils is coiled by winding in one direction on a mandrel, while the half-length of wire corresponding to the other single pancake coil is received by the mandrel and turns therewith. Thereafter, the second single pancake coil is coiled using the half-length that previously turned with the mandrel, by turning in the opposite direction.

The uniformity desired for a magnet for use in MRI may typically be of the order of 0.1 parts per million (ppm) in the volume of interest. The field produced at all points in space by the elements of a double pancake coil (zone inside the transition and the spiral portions) must therefore be calculated with accuracy of $10^{-9} B_0$, or smaller. It is possible to select shapes for the central transition zone 30 and for the plane spiral portions 10 and 20 that make it easier to calculate the field produced, while also being suitable for practical manufacture with very great mechanical precision.

The central transition zone 30 may be very close to the volume of interest for the most double pancake coils closest to the center, and therefore it needs to be designed with care.

The origin for the angular cylindrical coordinate $\phi$ is taken as being the center of the transition zone, said transition zone extending over a range $[-\phi_0, \phi_0]$ where $\phi_0 \leq \pi$ is an angle that is to be selected. If $\phi_0$ is small, the transition will be rather sudden and the conductor will need to be "twisted" quite strongly, however the mechanical spacers for guiding the conductor are quite easy to fabricate. With increasing $\phi_0$, the transition is made "gentler" so far as the conductor is concerned, but the guide spacers become more difficult to make. A good compromise consists in making the transition over half a turn, i.e. $\phi_0 = \pi/2$. Nevertheless, if account is taken of all optimization factors, it can be found to be preferable to select a smaller value for $\phi_0$, for example a value of 30°.

The simplest shape that leads to expressions that can be integrated with the accuracy desired for calculating the field produced by wires, thin strips, or rectangular sections with uniform current density, consists in giving the conductor, when flat, the shape of a portion of a sinewave extending between a consecutive minimum and maximum, and winding it around a cylinder of circular section. The edges of the section of the conductor and the current lines thus have equations of the following forms:

$$x = a\cos t,\ y = a\sin t,\ z = h\sin\frac{\pi}{2}\frac{\varphi}{\varphi_0}$$

Figure 2:
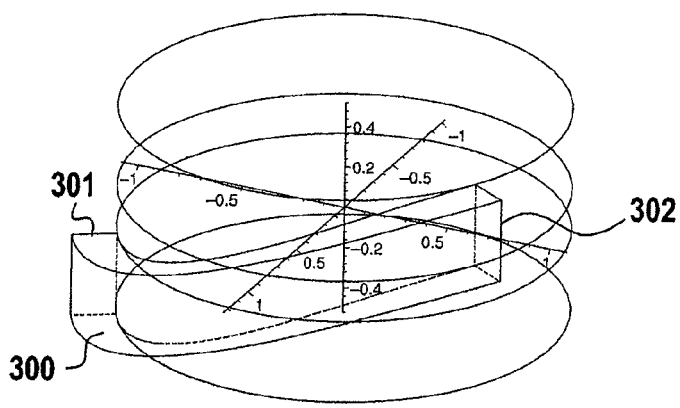
FIG. 2 shows an example of a transition segment of the sinusoidal ring type suitable for being implemented in the FIG. 1 modular element.
Figure 3:
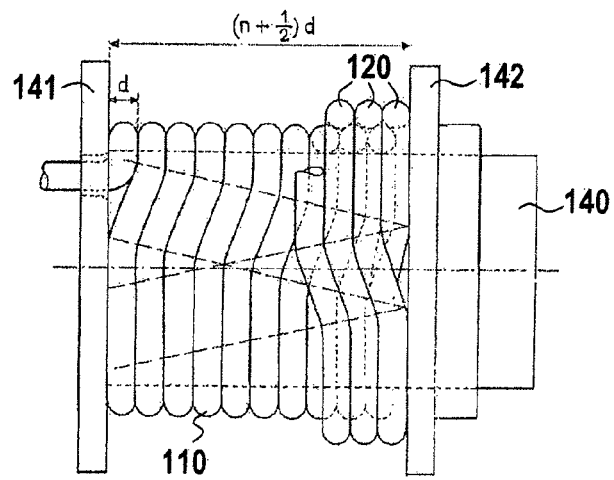
FIG. 3 is an elevation view showing an example of layer coil.

Such a curve is referred to as a "sinusoidal ring" and constitutes a special case of the 3D Lissajous curve. FIG. 2 shows a transition segment 300 for $\varphi_0=\pi/3$ made in this way and terminating in ends 301 and 302 for connection to the plane spiral-wound portions.

The thickness of the conductor constituting the single pancake coils is constant, so the conductor for each of the single pancake coils connecting geometrically with the transition zone may be an Archimedes' spiral, which is very easy to make.

Nevertheless, in a preferred embodiment of the present invention, in order to facilitate accurate calculation of the magnetic field produced by single pancake coils, they are made using half-circumferences of radius that increases by half the thickness of the conductor between two consecutive half-circumferences.

It is known how to calculate with very great accuracy the field that is produced by wires, thin strips, or conductors of rectangular section with uniform current density when they are in the form of circular arcs. This shape can thus be preferred and it is just as easy to make as an Archimedes' spiral.

Figure 7:
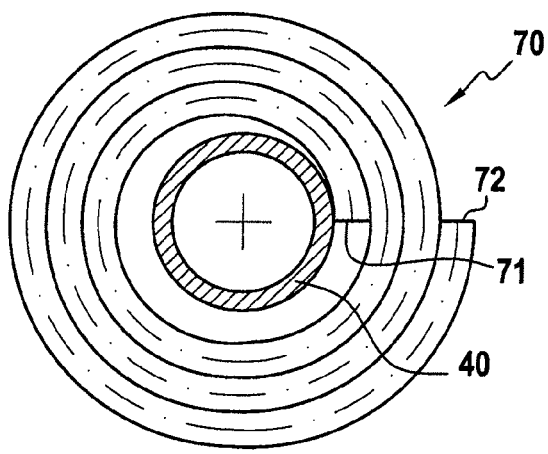
FIG. 7 is a plan view of a single pancake coil as shown in FIG. 4.
Figure 8:
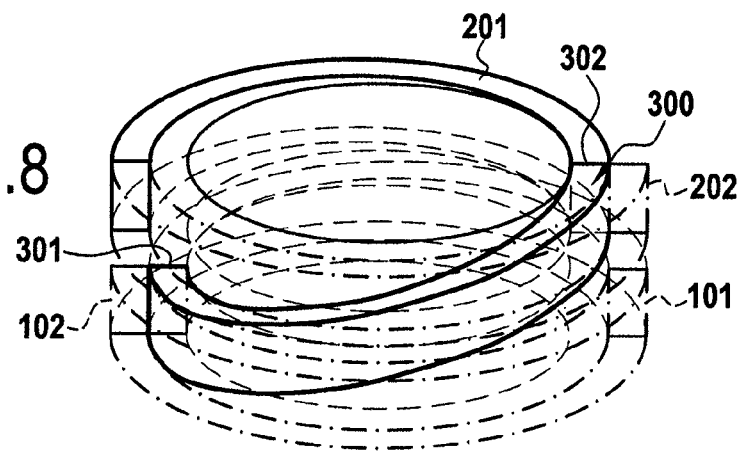
FIG. 8 is a perspective view showing the process of associating circular half-turns with a transition segment to build up a double-pancake coil modular element.

FIGS. 7 and 8 show situations in which the spiral-wound pancake coils are such that connections are made between half-circumferences of radii that increase by half the thickness of the conductor between two consecutive half-circumferences. The example shown corresponds to a transition zone occupying half a turn ($\varphi_0=\pi/2$), so the half-circumferences alternate between two centers that are separated by half the thickness of the conductor. For other values of $\varphi_0$, there are analogous combinations of circumference portions.

FIG. 7 is a face view of a single pancake coil 70 having an inner end 71 that is to connect without any junction to a transition segment, and an outer end 72 that is to be connected via a junction to another outer end of an adjacent modular element.

FIG. 8 is a perspective view of a portion of a double pancake coil with the transition segment 300 having ends 301, 302 formed in bold lines, with the first half-circumferences 101 and 201 that are connected respectively to the ends 301 and 302 of the transition segment 300 being drawn in fine continuous lines, and with the following half-circumferences 102 and 202 that are connected respectively to the half-circumferences 101 and 201 being drawn with chain-dotted lines.

Figure 9:
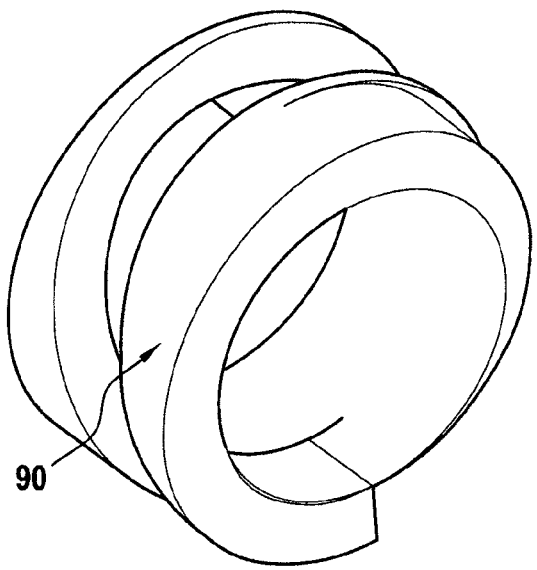
FIG. 9 is a perspective view showing an example of a central guide spacer suitable in the process for fabricating a double-pancake coil modular element of the invention.

For the same example with $\varphi_0$ having a value equal to $\pi/2$, FIG. 9 shows the shape of a central guide spacer 90 for guaranteeing the shape of the transition segment 300 and of the first half-turn 101, 201 of each single pancake coil, with winding subsequently naturally taking on the desired shape.

Mention is made above of calculating the field produced by wires, thin strips, or rectangular sections of uniform current density for a transition zone in the form of a sinusoidal ring, and for circular arcs. It is thus possible to take into consideration the internal structure of the conductor that is used together with the actual distribution of the current conveyed by the superconductor strands. It is possible to consider each strand as a wire (there are many of them but calculation is also much faster), or to consider a set of wires as a thin strip as exists in a Rutherford type cable, or to consider a uniform density section (e.g. the rectangular section of dimensions w×e in FIG. 15) corresponding to the set of strands making up a one-piece conductor, the set itself being surrounded by copper that does not carry current.

Figure 14:
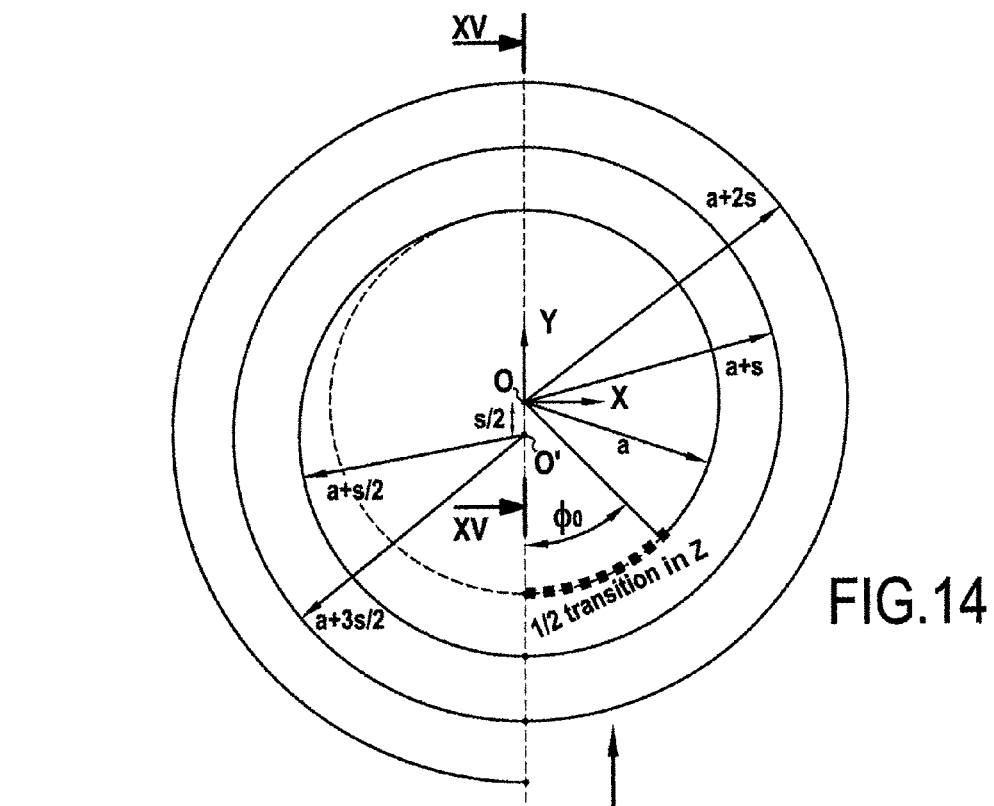
FIG. 14 is a view showing the shape of the neutral fiber in half of a double pancake coil of the invention.
Figure 14A:
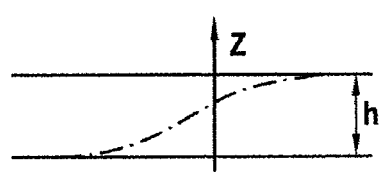
FIG. 14A is a view seen looking along arrow XIVA of FIG. 14.
Figure 15:
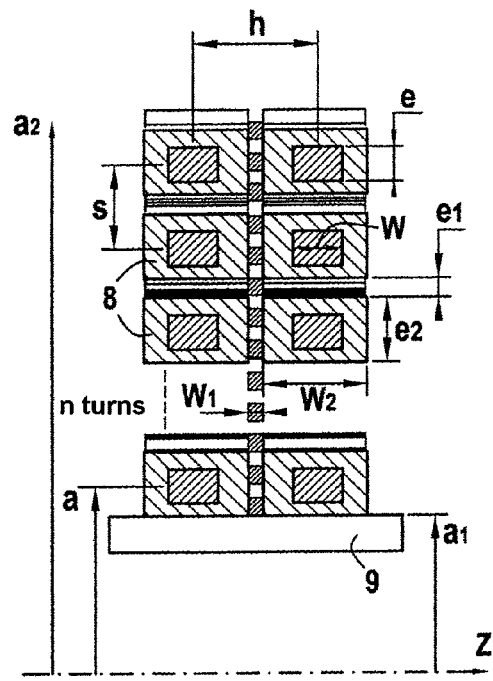
FIG. 15 is a diagrammatic axial half-section view on line XV-XV of FIG. 14, showing the various windings of a double pancake coil of the invention.

FIGS. 14, 14A, and 15 seek to make it easier to understand how a double pancake coil is made in a preferred embodiment of the invention that is adapted to making magnets for producing fields that are very uniform.

FIG. 14 shows the shape of the neutral fiber of half a double pancake coil that is made up of semicircles of increasing radii and of alternating centers O and O'.

FIG. 14A is a view looking along arrow XIVA in FIG. 14 and shows the transition zone that extends over a total height h along the axis z. If $\varphi_0$ is the angle over which half of the transition zone extends, and if the origin of the angular cylindrical coordinate $\varphi$ of a point of the transition zone is taken as being the center of the transition zone, then at each point on the neutral fiber of the transition zone, the coordinate $z(\varphi)$ is given by the following formula:

$$z(\varphi) = \frac{h}{2}\cdot\sin\!\left(\frac{\pi}{2}\cdot\frac{\varphi}{\varphi_0}\right).$$

FIG. 15 is a section on the plane YOZ in FIG. 14 showing an example of half a double pancake coil extending around a mandrel 9.

In FIG. 15, there can be seen the two spiral windings 8 and the distance h between the neutral fibers of the two juxtaposed single pancake coils 8, said distance h corresponding to the height of the transition zone along the axis Oz that is itself constituted by the central axis of the mandrel 9 and of the double pancake coil.

In the radial direction (axes OX or OY), the distances correspond to the distance between the neutral fibers of two successive turns.

If $e_2$ is the width of a turn of rectangular section in the radial direction, and if $e_1$ is the empty space between two contiguous turns, then:

$$s = e_1 + e_2$$

Furthermore, if the length of a rectangular section turn measured in the axial direction of the axis Oz is written $w_2$ and if the empty space along the axis Oz between two adjacent turns of two single pancake coils in a double pancake coil is written $w_1$, then:

$$h = w_1 + w_2$$

With reference again to FIG. 14, and using the notations specified above, for each of the windings or coils of a pancake coil, and starting from the beginning of the half-transition, the following half-turns are as follows:

---

First winding

First half-turn
radius a center O
Second half-turn
radius a + ½s center O'
ith winding -continued First half-turn
radius $a + (i - 1)s$ center O
second half-turn
radius $a + \frac{1}{2}(2i - 1)s$ center O'
nth winding First half-turn
radius $a + (n - 1)s$ center O
Second half-turn
radius $a + \frac{1}{2}(2n - 1)s$ center O'

With reference to FIG. 15, with turns of rectangular section having dimensions $w_2 \times e_2$ provided with insulation of thickness $e_1$ corresponding to the space between two consecutive turns, it is possible to use the following notation:

Overall inner radius
$a_1 = a - \frac{1}{2}e_2$
outer radius center O
(no insulation)

$$a_{21} = a + (n - 1)s + \frac{1}{2}e_2$$
$$= r_i + (n - 1)s + e_2$$

outer radius center O'
(no insulation)

$$a_{22} = a + \frac{1}{2}(2n - 1)s + \frac{1}{2}e_2$$
$$= r_i + \frac{1}{2}(2n - 1)s + e_2$$

outer radius center O
(with insulation)

$$a'_{21} = a + \frac{1}{2}(2n - 1)s + \frac{1}{2}e_1$$
$$= r_1 + ns$$

outer radius center O'
(with insulation)

$$a'_{22} = a + \frac{1}{2}(2n - 1)s + \frac{1}{2}e_1$$
$$= r_i + \frac{1}{2}(2n - 1)s$$

The two-pancake coil modular elements 8 made in the manner described above are associated in stacks or blocks in which the double pancake coils are united with one another by superconductor junctions or junctions that present as little electrical resistance as possible.

In order to build up a magnet that produces a uniform magnetic field, blocks 1 to 4 are associated, each coaxial about the axis z, with the blocks being spaced apart from one another by separations (FIGS. 10 to 13).

In order to design the various stacks or blocks making up a set of double pancake coils and thus twice the number of single pancake coils, it is possible to reason in a manner analogous to that described for example in U.S. Pat. No. 4,749,429 in which the individual components are Bitter disks instead of being spiral-wound single pancake coils.

In order to obtain a uniform magnetic field, it is thus necessary to have a set of single pancake coils equivalent to conductor disks of inner radius $a_1$ and of outer radius $a_2$, of given thickness, and spaced apart by insulators of thickness that is likewise given, each carrying a uniform current density:

$$\vec{j} = j_0 \vec{u}_\phi.$$

To obtain a uniform magnet of order $2p_0$ (first non-zero coefficient $Z_{2(p_0+1)}$), it is necessary to stack the pancake coils as tightly as possible (i.e. with spacers 15 of minimum thickness) in blocks that are themselves spaced apart by empty spaces so as to constitute $p_0+1$ blocks 1 to 4 in alignment on a common axis.

The inner radii $a_1$ of the blocks always correspond to the limit $a_1 = D/2$ where D is the diameter of the central access tunnel for the zone of interest if the magnetic field is to be as uniform as possible.

The outer radii $a_2$ of the blocks, the total thicknesses of the blocks (corresponding to the number of double pancake coils making up the blocks), and the lengths of the separations between blocks are determined by optimization calculation applying rules and principles that are summarized above concerning the optimization of superconductor magnets.

In general, the thickness of the blocks and of the separations increases going from the center towards the ends of the zone of interest situated within the central tunnel 40.

It suffices to place $p_0+1$ blocks in order to obtain the desired uniformity to order $2p_0$. Naturally, there is nothing preventing the use of a larger number of blocks, but that would imply using a greater weight of conductor, which would increase costs.

The outer radii $a_2$ can be designed so as to increase a little going from the center of the magnet towards the ends. Nevertheless it is also possible to require the outer radii $a_2$ of the double pancake coils all to be identical so as to increase the modular nature and make manufacture more rational.

In the examples of FIGS. 10, 11 and 12, 13, there is a main magnet made up of seven blocks, i.e. a central block 1 of small thickness, two blocks 2 that are symmetrical on either side of the central block and that present thickness that is very slightly greater than that of the central block 1, another pair of blocks 3 that are symmetrical on either side of the pair of blocks 2, the thickness of the blocks 3 itself being greater than the thickness of the blocks 2, and finally a pair of blocks 4 that is symmetrical about the pair of blocks 3, the thickness of the blocks 4 itself being considerably greater than that of the blocks 3. The separations between the blocks 2 and 3 extend over a length that is slightly greater than the length of the separations between the blocks 1 and 2. The separations between the blocks 3 and 4 themselves extend over a length that is greater than the length of the separations between the blocks 2 and 3.

The embodiments of FIGS. 10 to 13 thus comprise a total of seven blocks or stacks of modular elements 8 made up of double pancake coils.

These embodiments also show the use of external compensation coils 5, 6, 7 providing active shielding, i.e. by their presence reducing the magnetic field that is radiated outwards by the set of coils making up the magnet.

Figure 10:
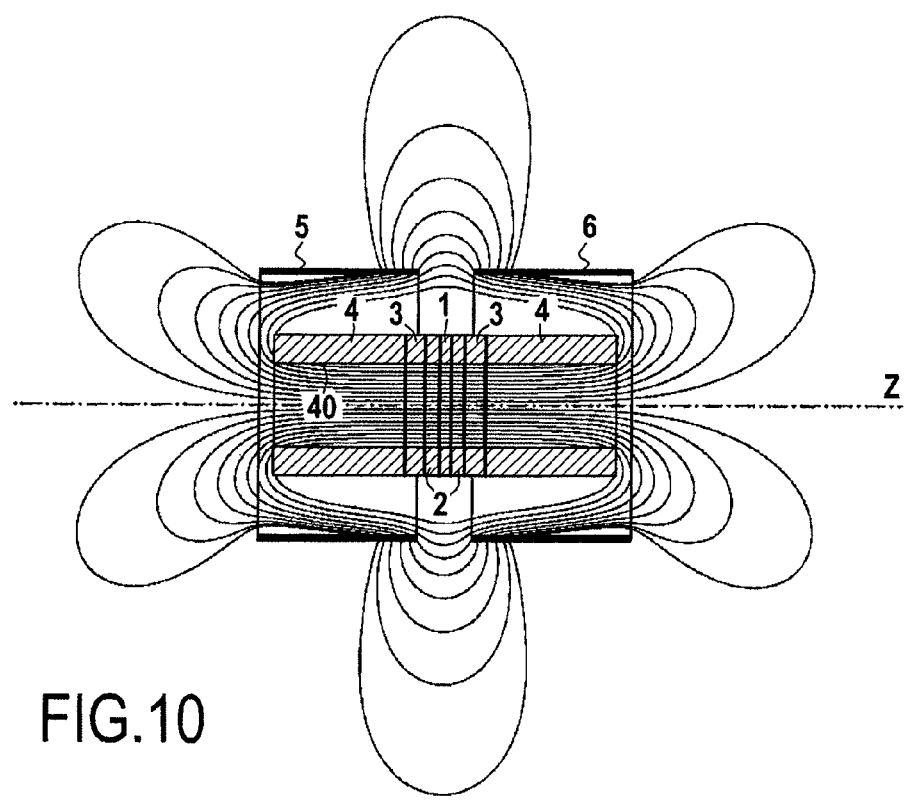
FIG. 10 is a diagrammatic axial section view showing a first example of a magnetic field creator device of the invention with a plot of the field lines produced.
Figure 11:
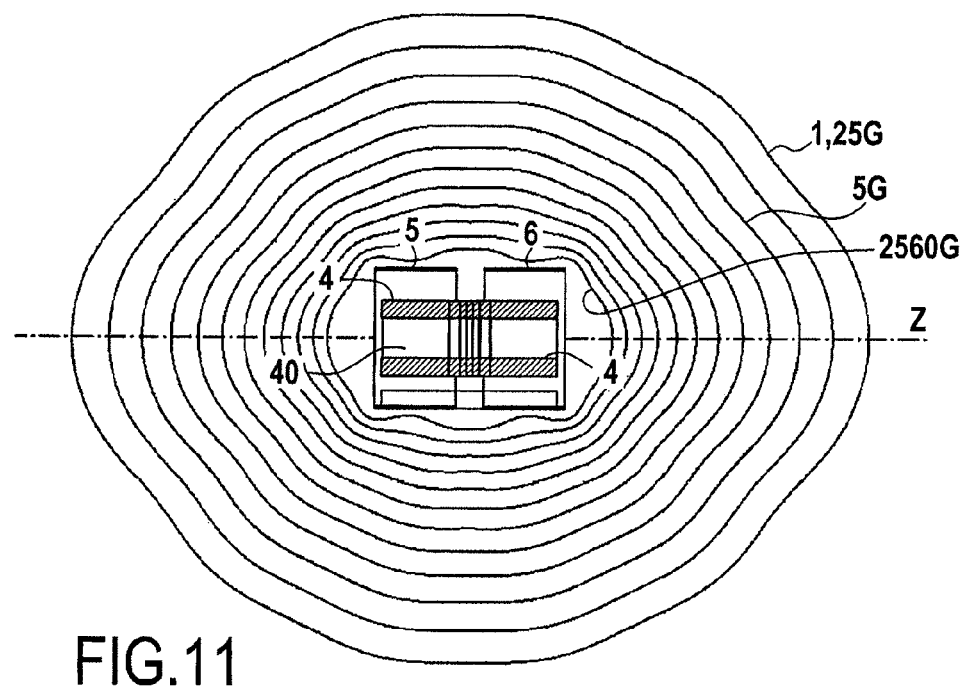
FIG. 11 is a diagrammatic view showing the constant-modulus contours of the residual external magnetic field created by the FIG. 10 device.
Figure 12:
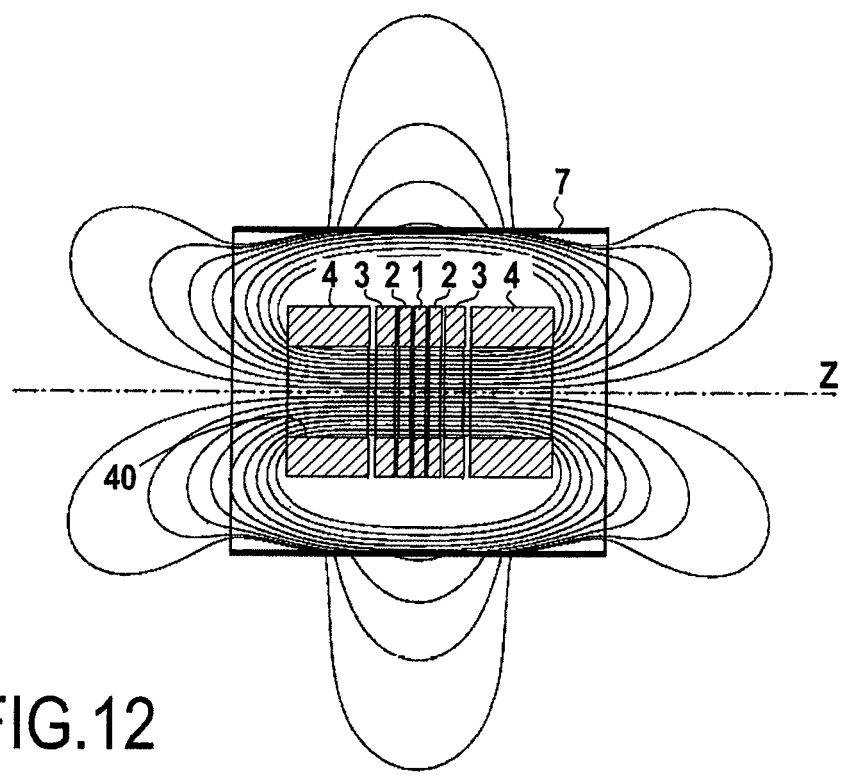
FIG. 12 is a diagrammatic axial section view of a second example of a magnetic field creator device of the invention, with a plot of the field lines produced.

In the embodiment of FIGS. 10 and 11, the compensation coils are organized as two sets 5, 6 constituted by coils in layers.

In general, there is no need to increase the number of compensation coils 5, 6, or 7, that carry current in the direction opposite to the current carried by the coils of the blocks 1 to 4. It is likewise pointless and expensive to require each of the coils to produce an internal field that is uniform, since it suffices that the total field is uniform.

The conditions for obtaining a field that is as uniform as possible in the volume of interest about an origin O is already described above.

It is possible to reason in similar manner for the purpose of characterizing the external field, this time considering a position outside a sphere of center O, the center of the magnet, and of radius $r_{min}$ that completely covers the magnetic field sources. The coils of the magnet are thus situated between this sphere and the above-defined sphere of radius $r_{max}$.

Outside this sphere, each component $B_x$, $B_y$, and $B_z$ of the magnetic field has a zero Laplacian and a single development in spherical harmonics. For example:

$$B_z(r, \theta, \varphi) = \sum_{n=2}^{\infty} \frac{1}{r^{n+1}} \left[ Z'_n P_n(\cos\theta) + \sum_{m=1}^{n} (X'^m_n \cos m\varphi + Y'^m_n \sin m\varphi) W^m_n P^m_n(\cos\theta) \right]$$

where summing begins at n=2 since there is no such thing as a magnetic monopole (the magnetic "correspondent" of electric charge).

As for the internal development, the set of coefficients $Z'_n$, $X'^m_n$, $Y'^m_n$ is unique and serves to express not only $B_z$, but also the other components of the field and the scalar and vector potentials from which it derives. Similarly, the functions:

$$\frac{1}{r^{n+1}} P^m_n(\cos\vartheta) \forall n \geq 2, 0 \leq m \leq n$$

constitutes a complete set of orthogonal functions which implies that the external field will decrease with distance from the center of the magnet more quickly when the shape of the field sources (coils) is such that all of these coefficients are zero for all degrees that are less than or equal to a given degree $n'_0$.

For a system of sources, as in the situation under consideration, that possesses axial symmetry or symmetry of revolution about the axis Oz and a plane of symmetry xOy, the development reduces to:

$$B_z(r, \theta, \varphi) = \sum_{p=1}^{\infty} Z'_{2p} \frac{1}{r^{2p+1}} P_{2p}(\cos\theta)$$

together with a component perpendicular to the axis:

$$B_\rho(r, \theta, \varphi) = \sum_{p=1}^{\infty} \frac{1}{2p} Z'_{2p} \frac{1}{r^{2p+1}} P^1_{2p}(\cos\theta)$$

The coefficients $Z'_{2p}$ are also known as the "moments" of the current distribution, $Z'_2$ being the dipolar moment, $Z'_4$ being the quadrupolar moment, . . . .

In order to design a magnet with optimized active shielding, it thus suffices to provide additional compensation coils that are always characterized by the following five parameters:

$$(\alpha'_1, \alpha'_2 > \alpha'_1, b'_1, b'_2 > b'_1, j'_0)_{i' \in [1,N']}$$

of radii greater than those of the main coil, with $j'_{0i'}$ of sign opposite to the $j_{0i}$ of the main coil, and to determine the 5(N+N') parameters of the coils in such a manner that the coefficients of the developments of the total field produced are such that:

$$Z_{2p} = 0 \, \forall p \leq p_0$$

in order to achieve the desired internal spatial uniformity, and:

$$Z'_{2p} = 0 \, \forall 0 p \leq p'_0$$

in order to achieve the desired rapid decrease in external field.

The conclusions of the optimization process are thus as follows:

it is necessary for the main magnet always to have at least $p_0+1$ blocks of thicknesses and separations that increase going from the center towards the ends. Their parameters must naturally be adjusted to take account of the presence of a compensation magnet;

it suffices to cancel the two first moments ($Z'_2 \equiv Z'_4 \equiv 0$) and possibly also the third moment ($Z'_6 \equiv 0$) in order to bring the 5 gauss limit to an acceptable distance from the center of the magnet. To do this, it suffices to use only one, two, or three compensation coils 5, 6. It is even possible to find configurations in which a single compensation coil 7 suffices to obtain $Z'_2 \equiv Z'_4 \equiv 0$, as in the embodiment of FIGS. 12 and 13;

the current transport capacity (superconductor volume) decreases with increasing outside radius $\alpha'_2$ of the compensation coils, so their thickness $\alpha_2 - \alpha'_1$ decreases. In the optimization process, it is therefore necessary to set an upper limit on said radius. Furthermore, small thickness encourages a layered configuration as opposed to a double-pancake coil configuration for the compensation coils. Since the compensation coils lie in a zone in which the field is relatively weak, it is advantageous to use a conductor other than that of the main magnet in order to increase the absolute value of the outside current density; and the presence of compensation coils not only reduces the outside field but also reduces the difference between the peak field in the main coils and the nominal field at the center. It is also possible to incorporate this parameter in the optimization process in order to make this difference as small as possible so as to make best possible use of the performance of the superconductor that is used, more particularly when it is close to its critical field.

The two embodiments shown in FIGS. 10, 11 and 12, 13 having seven blocks 1 to 4 for a main magnet and two blocks 5, 6 or one block 7 of compensation coils fed with currents flowing in the direction opposite to the flow direction of the currents flowing in the blocks 1 to 4 can be adapted to an installation having an inside tunnel 40 of diameter D=1 m, for example.

In a particular embodiment, the following values apply to the various parameters $B_0$ (basic magnetic field induction); D (diameter of inside tunnel), $J_0$ (current density); $V_{coil}$ (coil volume); and W (magnetic energy stored in the magnet):

$B_0$=11.7436T(500 MHz)

D=1 m $|j_0|$=34.612 amps per square millimeter (A/mm$^2$) (main magnet plus compensations)

$V_{coil}$=8.204 m$^3$

W=300 MJ.

In this particular example:

the main magnet is made up of 203 double pancake coils; and in order to use NbTi as the superconductor, the magnet is immersed in a bath of superfluid helium at normal pressure as disclosed in U.S. Pat. No. 3,992,893.

The theoretical uniformity ($p_0=6$) is governed by $Z_{14}$, i.e. better than 0.006 ppm in a sphere having a diameter of 200 mm, and better than 0.006 ppm in a sphere having a diameter of 500 mm. The outside field ($p'_0=2$) is governed by $Z'_6$, i.e. from the outside, the magnet is a hexapole, as represented by the field lines in FIGS. 10 and 12.

Figure 13:
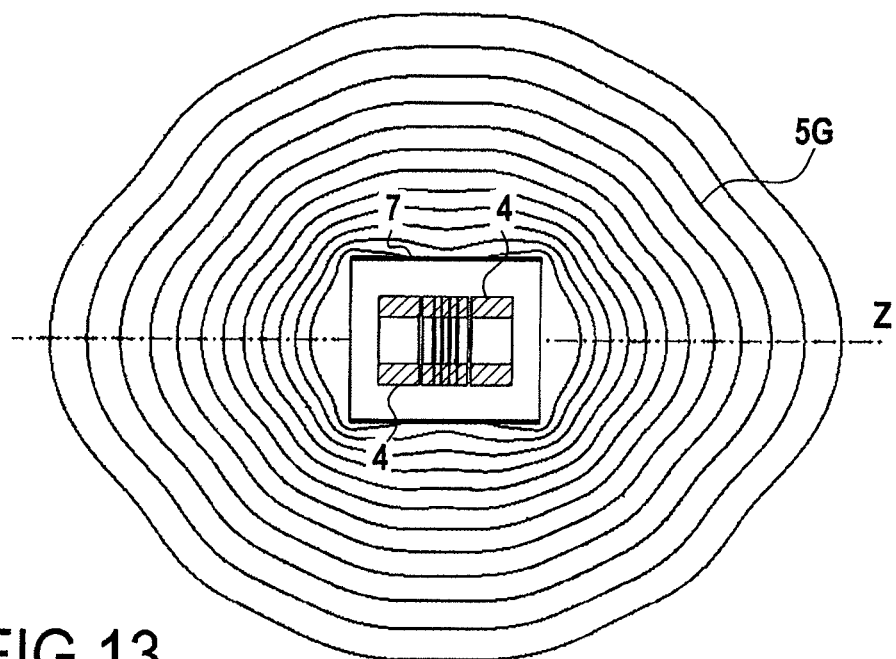
FIG. 13 is a diagrammatic view showing the constant-modulus contours of the residual external magnetic field created by the FIG. 12 device.

FIGS. 11 and 13 show the 5 gauss limit (0.5 mT limit), each of the other lines corresponding to a field value that is doubled compared with the preceding field line going towards the center, or half going away from the center. The outermost line thus corresponds to 1.25 gauss (0.125 mT), and the innermost line to 2560 gauss (0.256 T).

Finally, the maximum field on the conductor exceeds the field at the center of the magnet by only 0.418%, which is quite remarkable.

The invention claimed is:

1. A device for creating a uniform magnetic field in a zone of interest, in particular for nuclear magnetic resonance and magnetic resonance imaging, the device comprising an arrangement of superconductor coils placed around a longitudinal axis (z) of said zone of interest, which zone of interest lies inside said arrangement of superconductor coils, the device being characterized in that the arrangement of superconductor coils comprises at least one stack of a set of modular elements distributed along said longitudinal axis (z) and centered on said longitudinal axis (z), each modular element comprising a conductor of rectangular section made of superconductor material wound continuously in the form of a double pancake coil comprising a first single plane pancake coil, a second single plane pancake coil juxtaposed parallel to the first single pancake coil, and a transition segment without any internal junction between the first and second single pancake coils, each single pancake coil having a connection end situated at the outer peripheral portion of the pancake coil for connection via a junction to a connection end of an adjacent modular element, and the transition segment making it possible to offset the second single pancake coil along the longitudinal axis (z) relative to the first single pancake coil through a distance not less than the transverse dimension of the conductor along said axis, each of the first and second single plane pancake coils being made from half-circumferences of radius increasing by half the thickness of the conductor between two consecutive half-circumferences, and alternating between two centers for the half-circumferences that are separated by half the thickness of the conductor.

2. A device according to claim 1, characterized in that first insulating spacers are disposed between the first single pancake coil and the second single pancake coil within each modular element, and second insulating spacers are disposed between successive modular elements.

3. A device according to claim 1, characterized in that the transition segment extends around the longitudinal axis (z) over an extent of less than $2\pi$.

4. A device according to claim 3, characterized in that the transition segment extends around the longitudinal axis (z) over an extent that is less than $\pi$.

5. A device for creating a uniform magnetic field in a zone of interest, in particular for nuclear magnetic resonance and magnetic resonance imaging, the device comprising an arrangement of superconductor coils placed around a longitudinal axis (z) of said zone of interest, which zone of interest lies inside said arrangement of superconductor coils, the device being characterized in that arrangement of superconductor coils comprises at least one stack of a set of modular elements distributed along said longitudinal axis (z) and centered on said longitudinal axis (z), each modular element comprising a conductor rectangular section made of superconductor material wound continuously in the form of a double pancake coil comprising a first single plane pancake coil, a second single plane pancake coil juxtaposed parallel to the first single pancake coil, and a transition segment without any internal junction between the first and second single pancake coils, each single pancake coil having a connection end situated at the outer peripheral portion of the pancake coil for connection via a junction to a connection end of an adjacent modular element, and the transition segment making it possible to offset the second single pancake coil along the longitudinal axis (z) relative to the first single pancake coil through a distance not less than the transverse dimension of the conductor along said axis, each of the first and second single plane pancake coils being made from half-circumferences of radius increasing by half the thickness of the conductor between two consecutive half-circumferences, and alternating between two centers for the half-circumferences that are separated by half the thickness of the conductor, and in that the transition segment is made in the form of a sinusoidal ring constituted by winding a sinewave around a circular cylinder having said longitudinal axis (z) as its axis.

6. A device according to claim 1, characterized in that each stack comprises several tens of identical modular elements.

7. A device for creating a uniform magnetic field in a zone of interest, in articular for nuclear magnetic resonance and magnetic resonance imaging, the device comprising an arrangement of superconductor coils placed around a longitudinal axis (z) of said zone of interest, which zone of interest lies inside said arrangement of superconductor coils, the device being characterized in that the arrangement of superconductor coils comprises at least one stack of a set of modular elements distributed along said longitudinal axis (z) and centered on said longitudinal axis (z), each modular element comprising a conductor of rectangular section made of superconductor material wound continuously in the form of a double pancake coil comprising a first single plane pancake coil, a second single plane pancake coil juxtaposed parallel to the first single pancake coil, and a transition segment without any internal junction between the first and second single pancake coils, each single pancake coil having a connection end situated at the outer peripheral portion of the pancake coil for connection via a junction to a connection end of an adjacent modular element, and the transition segment making it possible to offset the second single pancake coil along the longitudinal axis (z) relative to the first single pancake coil through a distance not less than the transverse dimension of the conductor along said axis, each of the first and second single plane pancake coils being made from half-circumferences of radius increasing by half the thickness of the conductor between two consecutive half-circumferences, and alternating between two centers for the half-circumferences that are separated by half the thickness of the conductor, and in that it comprises at least seven stacks of identical modular elements disposed in alignment along said longitudinal axis (z) and symmetrically about a midplane of the zone of interest that is perpendicular to said longitudinal axis (z), the thicknesses of the stacks and the lengths of the empty separation spaces between pairs of adjacent stacks increasing going away from the midplane towards the ends of the device.

8. A device for creating a uniform magnetic field in a zone of interest, in particular for nuclear magnetic resonance and magnetic resonance imaging, the device comprising an arrangement of superconductor coils placed around a longitudinal axis (z) of said zone of interest, which zone of interest lies inside said arrangement of superconductor coils, the device being characterized in that the arrangement of superconductor coils comprises at least one stack of a set of modular elements distributed along said longitudinal axis (z) and centered on said longitudinal axis (z), each modular element comprising a conductor of rectangular section made of superconductor material wound continuously in the form of a double pancake coil comprising a first single plane pancake coil, a second single plane pancake coil juxtaposed parallel to the first single pancake coil, and a transition segment without any internal junction between the first and second single pancake coils, each single pancake coil having a connection end situated at the outer peripheral portion of the pancake coil for connection via junction to a connection end of an adjacent modular element, and the transition segment making it possible to offset the second single pancake coil along the longitudinal axis (z) relative to the first single pancake coil through a distance not less than the transverse dimension of the conductor along said axis, each of the first and second single plane pancake coils being made from half-circumferences of radius increasing by half the thickness of the conductor between two consecutive half-circumferences, and alternating between two centers for the half-circumferences that are separated by half the thickness of the conductor, and in that it further comprises at least one superconductive compensation coil surrounding the stacks of modular elements (8) and presenting an axis that coincides with the longitudinal axis (z), said superconductive compensation coil conveying a current in the direction that is opposite to the direction of the current in said stacks.

9. A device according to claim 8, characterized in that the set of stacks and of compensation coils conveying currents is such that at least the dipolar moment $Z'_2$ of the current distribution corresponding to the magnetic field outside the zone of interest is zero, while simultaneously the coefficients $Z_{2p}$ of the development of the magnetic field in the zone of interest are zero up to a fixed order $Z_{2p0}$ greater than 2.

10. A device according to claim 8, characterized in that the set of stacks and of compensation coils conveying currents is such that at least the dipolar moment $Z'_2$ and the quadrupolar moment $Z'_4$ of the current distribution corresponding to the magnetic field outside the zone of interest are zero, while simultaneously the coefficients $Z_{2p}$ of the development of the magnetic field in the zone of interest are zero up to a fixed order $Z_{2p0}$ greater than 2.

11. A device according to claim 8, characterized in that the set of stacks and of compensation coils conveying currents is such that the multipolar magnetic moments of the current distribution corresponding to the magnetic field outside the zone of interest are zero from the minimum order 2 ($Z'_2$) up to a fixed order $Z'_{2p0}$ greater than 2, while simultaneously the coefficients $Z_{2p}$ of the development of the magnetic field in the zone of interest are zero up to a fixed order $Z_{2p0}$ greater than 2.

12. A device according to claim 8, characterized in that the superconductive compensation coil is made in the form of a layer coil.

13. A device according to claim 1, characterized in that the stacks of modular elements are placed around a zone of interest of diameter equal to or greater than 1 meter.

14. A device according to claim 1, characterized in that the magnetic field created by the stacks of modular elements is greater than or equal to 10 T.

15. A device for creating a uniform magnetic field in a zone of interest, in particular for nuclear magnetic resonance and magnetic resonance imaging, the device comprising an arrangement or superconductor coils placed around a longitudinal axis (z) of said zone of interest, which zone of interest, lies inside said arrangement of superconductor coils, the device being characterized in that the arrangement of superconductor coils comprises at least one stack of a set of modular elements distributed along said longitudinal axis (z) and centered on said longitudinal axis (z), each modular element comprising a conductor of rectangular section made of superconductor material wound continuously in the form of a double pancake coil comprising a first single plane pancake coil, a second single plane pancake coil juxtaposed parallel to the first single pancake coil, and a transition segment without any internal junction between the first and second single pancake coils, each single pancake coil having a connection end situated at the outer peripheral portion of the pancake coil for connection via a junction to a connection end of an adjacent modular element, and the transition segment making it possible to offset the second single pancake coil along the longitudinal axis (z) relative to the first single pancake coil through a distance not less than the transverse dimension of the conductor along said axis, each of the first and second single plane pancake coils being made from half-circumferences of radius increasing by half the thickness of the conductor between two consecutive half-circumferences, and alternating between two centers for the half-circumferences that are separated by half the thickness of the conductor, and in that the rectangular section of the conductor of a modular element lies in the range a few square millimeters to several tens of square millimeters.

16. A device according to claim 1, characterized in that a modular element presents weight lying in the range a few tens of kilograms to about one hundred kilograms.

17. A device for creating a uniform magnetic field in a zone of interest, in particular for nuclear magnetic resonance and magnetic resonance imaging, the device comprising an arrangement of superconductor coils placed around a longitudinal axis (z) of said zone of interest, which zone of interest lies inside said arrangement of superconductor coils, the device being characterized in that the arrangement of superconductor coils comprises at least one stack of a set of modular elements distributed along said longitudinal axis (z) and centered on said longitudinal axis (z), each modular element comprising a conductor of rectangular section made of superconductor material wound continuously in the form of a double pancake coil comprising a first single plane pancake coil, a second single plane pancake coil juxtaposed parallel to the first single pancake coil, and a transition segment without any internal junction between the first and second single pancake coils, each single pancake coil having a connection end situated at the outer peripheral portion of the pancake coil for connection via a junction to a connection end of an adjacent modular element, and the transition segment making it possible to offset due second single pancake coil along the longitudinal axis (z) relative to the first single pancake coil through a distance not less than the transverse dimension of the conductor along said axis, each of the first and second single plane pancake coils being made from half-circumferences of radius increasing by half the thickness of the conductor between two consecutive half-circumferences, and alternating between two centers for the half-circumferences that are separated by half the thickness of the conductor, and in that first insulating spacers are disposed between the first single pancake coil and the second single pancake coil within each modular element, and second insulating spacers are disposed between successive modular elements, and in that the transition segment extends around the longitudinal axis (z) over an extent of less than $2\pi$;

the transition segment extends around the longitudinal axis (z) over an extend that is less than $\pi$;

the transition segment is made in the form of a sinusoidal ring constituted by winding a sinewave around a circular cylinder having said longitudinal axis (z) as its axis;

each stack comprises several tens of identical modular elements;

it comprises at least seven stacks of identical modular elements disposed in alignment along said longitudinal axis (z) and symmetrically about a midplane of the zone of interest that is perpendicular to said longitudinal axis (z), the thicknesses of the stacks and the lengths of the empty separation spaces between pairs of adjacent stacks increasing going away from the midplane towards the ends of the device;

it further comprises at least one superconductive compensation coil surrounding the stacks of modular elements and presenting an axis that coincides with the longitudinal axis (z), said superconductive compensation coil conveying a current in the direction that is opposite to the direction of the current in said stacks;

the superconductive compensation coil is made in the form of a layer coil;

the stacks of modular elements are placed around a zone of interest of diameter equal to or greater than 1 meter;

the magnetic field created by the stacks of modular elements is greater than or equal to 10 T;

the section of the conductor of a modular element lies in the range a few square millimeters to several tens of square millimeters;

a modular element presents weight lying in the range a few tens of kilograms to about one hundred kilograms.

\* \* \* \* \*

UNITED STATES PATENT AND TRADEMARK OFFICE
CERTIFICATE OF CORRECTION

PATENT NO. : 7,952,454 B2
APPLICATION NO. : 12/159282
DATED : May 31, 2011
INVENTOR(S) : Guy Aubert It is certified that error appears in the above-identified patent and that said Letters Patent is hereby corrected as shown below:

Column 2, line 55, "Il" should read --I$\ell$--;

Column 2, line 55, "l" should read --$\ell$--;

Column 18, claim 7, line 30, "articular" should read --particular--;

Column 19, claim 8, line 20, "via junction" should read --via a junction--;

Column 20, claim 15, line 7, "or" should read --of--; and

Column 20, claim 17, line 62, "due" should read --the--.

Signed and Sealed this
Second Day of October, 2012

David J. Kappos
*Director of the United States Patent and Trademark Office*